(12) United States Patent
Nestleroad et al.

(10) Patent No.: US 8,914,257 B1
(45) Date of Patent: Dec. 16, 2014

(54) SIMULATING A SURFACE OF A STRUCTURE

(75) Inventors: Mark Edward Nestleroad, Marysville, WA (US); Richard Michael Coleman, Renton, WA (US)

(73) Assignee: The Boeing Company, Chicago, IL (US)

( * ) Notice: Subject to any disclaimer, the term of this patent is extended or adjusted under 35 U.S.C. 154(b) by 701 days.

(21) Appl. No.: 12/549,093

(22) Filed: Aug. 27, 2009

(51) Int. Cl.
*G06F 17/50* (2006.01)

(52) U.S. Cl.
USPC ................... 703/1; 703/2; 345/586; 345/598; 345/599; 345/643; 345/655

(58) Field of Classification Search
USPC ................... 702/17, 19; 345/418, 419, 420
See application file for complete search history.

(56) References Cited

U.S. PATENT DOCUMENTS

| 2007/0150124 A1 | 6/2007 | Wipplinger et al. |
| 2008/0288164 A1 | 11/2008 | Lewis et al. |
| 2009/0204453 A1 | 8/2009 | Cooper et al. |

OTHER PUBLICATIONS

Nigam et al. Review of Statistical Approaches to Tolerance Analysis Computer-Aided Design vol. 27 No. 1 Jan. 1995 pp. 6-15.*
Camelio et al. Compliant Assembly Variation Analysis Using Component Geometric Covariance Journal of Manufacturing Science and Engineering, ASME May 2004 pp. 355-360.*
Salomons et al. A Computer aided Tolerancing Tool II: Tolerance Analysis Computers in Industry 31, 1996 pp. 175-186.*
"Dimensioning and Tolerancing—Engineering Drawing and Related Documentation Practices", ASME Y14.5—2009, The American Society of Mechanical Engineers,2009, pp. 1-228.
"Controller Procedures", IVAO United Kingdom, pp. 1-5, retrieved Aug. 13, 2009 http://oc.ivao.ca/controllers.php.
"The International Flight Information Manual (IFIM) AC 91-70 Oceanic Operations, an Authoritative Guide to Oceanic Operations (Sep. 6, 1994)", retrieved Aug. 13, 2009 http://www.faa.gov/ats/att/ifim/ac91-70.htm.
"Flight planning from take-off to landing", Inflight Monitor—Lufthansa Systems, 1 pg., retrieved Aug. 14, 2009 http://www.lhsystem.com/solutions/airline-solutions/airline-operations-solutions/sp/inflight.
Bogard, Timothy V., "Variation Behavioral Modeling and Analysis Optimized for Virtual Product Design Through Manufacturing Process Development", Sigmetrix, LLC, Jul. 7, 2003.

* cited by examiner

*Primary Examiner* — Omar Fernandez Rivas
*Assistant Examiner* — Cuong Luu
(74) *Attorney, Agent, or Firm* — Yee & Associates, P.C.

(57) ABSTRACT

An advantageous embodiment of the present disclosure provides a method for simulating a surface of a structure, the method comprising selecting points on the surface of the structure; identifying a rate of change constraint for each of the points to form a plurality of rate of change constraints, wherein the rate of change constraint is a maximum deviation for a point with respect to an adjacent point; and generating a number of surfaces for the structure using the points and the plurality of rate of change constraints.

15 Claims, 10 Drawing Sheets

SIMULATING A SURFACE OF A STRUCTURE

BACKGROUND INFORMATION

1. Field

The present disclosure relates generally to simulating variation in manufacturing, and in particular to designed objects. Still more particularly, the present disclosure relates to a method and apparatus of simulating surfaces of a structure.

2. Background

When parts and assemblies are manufactured, variances may occur in the dimensions of manufactured parts or the assembly of parts. Engineers attempt to consider and account for such variances when designing the parts and assemblies by designing each measurement within a part or assembly with a tolerance.

A tolerance allows a manufactured part to be considered acceptable if all the variation in measurements on the manufactured part fall within the chosen range of tolerance. The tolerance may be chosen by the engineer or other actor in the engineering process based on a balance between engineering requirements and manufacturing costs. As tolerances decrease, that is, the requirement for the manufactured part become more stringent, manufacturing costs increase. Manufacturing costs may increase because the manufacturer will require more precise tooling to make parts that will meet the stringent tolerance requirements. Manufacturing costs may also increase because more manufactured parts will be deemed unacceptable during the manufacturing process.

For example, an engineer may be designing a door for an airplane. It is an engineering requirement that the door make a tight seal with the fuselage. The engineer must, however, keep manufacturing costs as low as possible. Therefore, the engineer may specify a tolerance for the measurements, that is, that all the measurements for the edges around the door may vary by a certain distance in any direction. When the door is built, this tolerance allows the builder to accept parts that have edges with measurements that are not exact to the specified design, but will still meet the requirement that the door make a tight seal with the fuselage.

Engineers use a language called Geometric Dimensioning and Tolerancing (GD&T) to describe the tolerance of measurements in their design. Engineers may send part designs including Geometric Dimensioning & Tolerancing for the various measurements of a part to an analyst to determine approximately what percent of parts or assemblies of parts manufactured with the given tolerances will fail to meet the engineering requirements.

To perform the analysis, the analyst may use a computer to recreate the design of the part, including specified measurements and tolerances in virtual space. The analyst then simulates the manufacturing of the parts with the specified tolerance range. The analyst then reaches a determination on the approximate percentage of parts or assemblies that would not meet the engineering specification.

Currently, however, the simulation does not accurately represent tolerances that are specified by the engineer as a rate of change for a surface. The rate of change may be specified over a particular distance. An example is 0.005/5, that is, the measurement may vary 0.005 inches in a positive or negative direction over a run of 5 inches. Since the rate of change cannot be accurately represented in the simulation, the simulation returns inaccurate results for parts or assemblies that do not meet the specification. An inaccurately high result may cause an engineer to redesign parts unnecessarily, while an inaccurately low result may cause an unexpectedly high number of rejected parts when the part is actually manufactured. In either case, overall product costs are higher than if the simulation accurately represented rate of change tolerances.

Thus, it would be advantageous to have a method, a computer program product, and an apparatus that takes into account one or more of the issues discussed above, as well as possibly other issues.

SUMMARY

One advantageous embodiment of the present disclosure provides a method for simulating a surface of a structure, the method comprising selecting points on the surface of the structure; identifying a rate of change constraint for each of the points to form a plurality of rate of change constraints, wherein the rate of change constraint is a maximum deviation for a point with respect to an adjacent point; and generating a number of surfaces for the structure using the points and the plurality of rate of change constraints.

Another advantageous embodiment of the present disclosure provides a computer program product comprising a computer readable storage medium; program code, stored on the computer readable storage media, for selecting points on the surface of the structure; program code, stored on the computer readable storage media, for identifying a rate of change constraint for each of the points to form a plurality of rate of change constraints, wherein the rate of change constraint is a maximum deviation for a point with respect to an adjacent point in the points; and program code, stored on the computer readable storage media, for generating a number of surfaces for the structure using the points and the plurality of rate of change constraints.

Yet another advantageous embodiment of the present disclosure provides an apparatus comprising a bus; a memory connected to the bus; and a processor unit connected to the bus, wherein the processor unit is configured to select points on a surface of a structure; identify a rate of change constraint for each of the points to form a plurality of rate of change constraints, wherein the rate of change constraint is a maximum deviation for a point with respect to an adjacent point; and generate a number of surfaces for the structure using the points and the plurality of rate of change constraints.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives and advantages thereof, will best be understood by reference to the following detailed description of an advantageous embodiment of the present disclosure when read in conjunction with the accompanying drawings, wherein:

DETAILED DESCRIPTION

Figure 1:
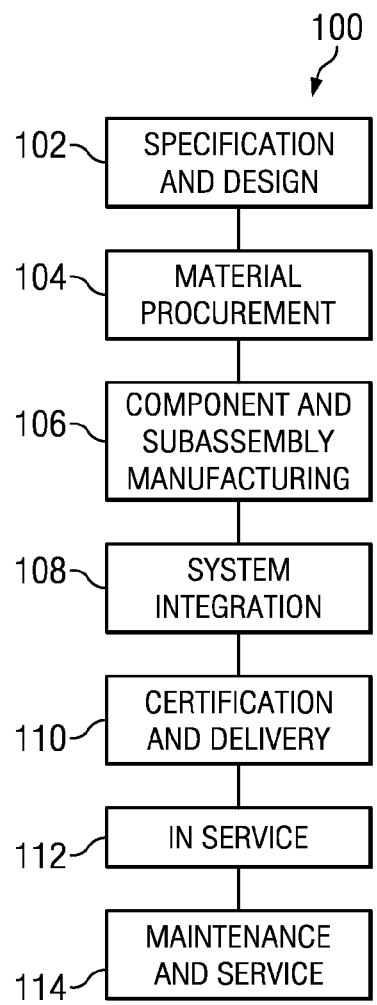
FIG. 1 depicts a diagram illustrating an aircraft manufacturing and service method in accordance with an advantageous embodiment.
Figure 2:
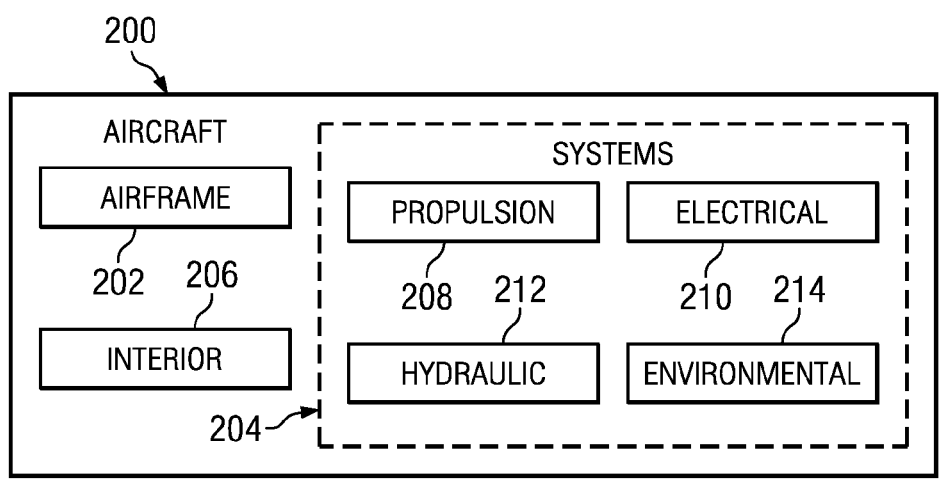
FIG. 2 depicts an illustration of an aircraft in which an advantageous embodiment may be implemented.

With reference now to the figures and in referring more particularly to the drawings, embodiments of the disclosure may be described in the context of aircraft manufacturing and service method 100 as shown in FIG. 1 and aircraft 200 as shown in FIG. 2. Turning first to FIG. 1, a diagram illustrating an aircraft manufacturing and service method is depicted in accordance with an advantageous embodiment. During pre-production, aircraft manufacturing and service method 100 may include specification and design 102 of aircraft 200 in FIG. 2 and material procurement 104.

During production, component and subassembly manufacturing 106 and system integration 108 of aircraft 200 in FIG. 2 takes place. Thereafter, aircraft 200 in FIG. 2 may go through certification and delivery 110 in order to be placed in service 112. While in service by a customer, aircraft 200 in FIG. 2 is scheduled for routine maintenance and service 114, which may include modification, reconfiguration, refurbishment, and other maintenance or service.

The illustrative examples may be implemented in specification and design 102 and/or the maintenance and service 114. In the case of specification and design 102, a component or subcomponent may be analyzed to determine whether a particular engineering specification will produce a certain quantity of usable components or subcomponents for all components or subcomponents manufactured. In the case of maintenance and service 114, a component or subcomponent may be analyzed to determine whether it is more efficient to continue replacing a broken component with a new component of the original design or to redesign the component. While specification and design 102 and service 114 are mentioned, the illustrative examples may be implemented in other phases as well.

Each of the processes of aircraft manufacturing and service method 100 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of venders, subcontractors, and suppliers; and an operator may be an airline, leasing company, military entity, service organization, and so on.

With reference now to FIG. 2, an illustration of an aircraft is depicted in which an advantageous embodiment may be implemented. In this example, aircraft 200 is produced by aircraft manufacturing and service method 100 in FIG. 1 and may include airframe 202 with a plurality of systems 204 and interior 206. Examples of systems 204 include one or more of propulsion system 208, electrical system 210, hydraulic system 212, and environmental system 214. Any number of other systems may be included. Although an aerospace example is shown, different advantageous embodiments may be applied to other industries, such as the automotive industry.

Apparatus and methods embodied herein may be employed during at least one of the stages of aircraft manufacturing and service method 100 in FIG. 1. As used herein, the phrase "at least one of", when used with a list of items, means that different combinations of one or more of the listed items may be used and only one of each item in the list may be needed. For example, "at least one of item A, item B, and item C" may include, for example, without limitation, item A or item A and item B. This example also may include item A, item B, and item C or item B and item C.

In one illustrative example, components or subassemblies produced in component and subassembly manufacturing 106 in FIG. 1 may be fabricated or manufactured in a manner similar to components or subassemblies produced while aircraft 200 is in service 112 in FIG. 1. As yet another example, a number of apparatus embodiments, method embodiments, or a combination thereof may be utilized during production stages, such as component and subassembly manufacturing 106 and system integration 108 in FIG. 1. A number, when referring to items means, one or more items. For example, a number of apparatus embodiments is one or more apparatus embodiments. A number of apparatus embodiments, method embodiments, or a combination thereof may be utilized while aircraft 200 is in service 112 and/or during maintenance and service 114 in FIG. 1. The use of a number of the different advantageous embodiments may substantially expedite the assembly of and/or reduce the cost of aircraft 200.

The different advantageous embodiments recognize that accurately representing the engineering definition of a surface in a dimensional analysis is a key component to obtaining an accurate dimensional analysis. By simulating a rate of change over a distance on the surface specified in the engineering definition instead of simplifying the engineering definition to an overall tolerance requirement, the advantageous embodiments simulate the variation of the measurements on the surface with greater accuracy than a simplified overall tolerance simulation. In a part design and assembly example, the simulation that simulates rate of change over a distance leads to rejection of fewer parts that meet the engineering definition and the acceptance of fewer parts that do not meet the engineering definition.

In view of these considerations and/or possibly other considerations, the different advantageous embodiments recognize that it would be advantageous to have a method, apparatus, and computer program product that takes into account one or more of the issues discussed above as well as possibly other issues.

Figure 3:
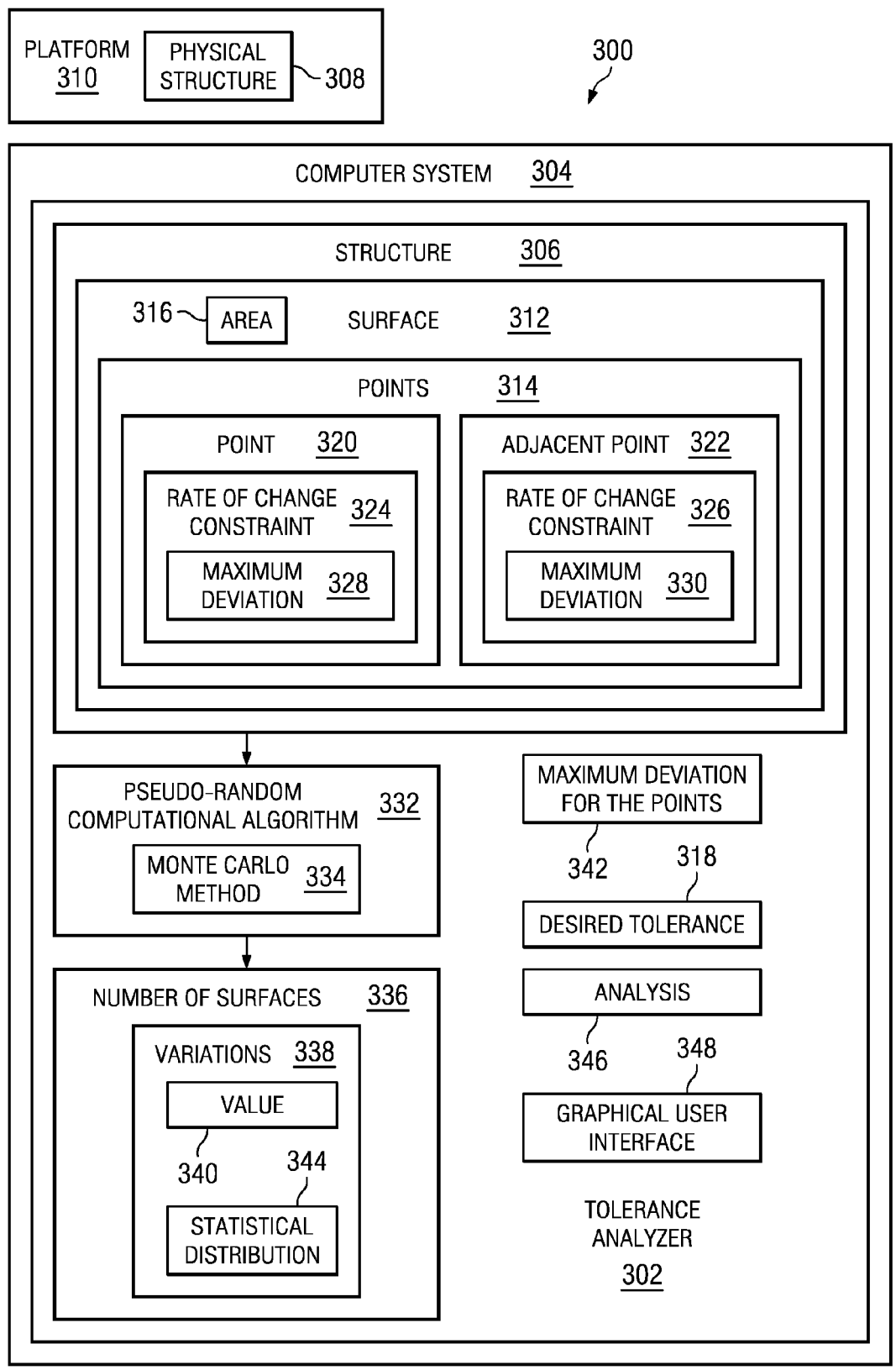
FIG. 3 depicts an illustration of a design environment in accordance with an advantageous embodiment.

Turning now to FIG. 3, an illustration of a design environment is depicted in accordance with an advantageous embodiment. In this illustrative example, design environment 300 may be used in the design of aircraft 200 in FIG. 2. Design environment 300 may be used to design structures for aircraft 200.

As depicted, design environment 300 includes tolerance analyzer 302. Tolerance analyzer 302 is software that runs on computer system 304. Computer system 304 is a number of computers in these examples.

Tolerance analyzer 302 executes on computer system 304. Structure 306 may be a virtual model of a physical structure 308. Physical structure 308 may be a platform 310, a component of platform 310, or a subcomponent of platform 310. Platform 310 may be an aircraft, such as aircraft 200 from FIG. 2. A non-limiting example of physical structure 308 is a fuselage door. In this example, structure 306 may be a virtual model of the fuselage door of aircraft 200. Structure 306 may consist of information. This information may include, for example, without limitation, points, lines, a coordinate system, processing information, dimensions, materials, call outs, notes, and other suitable information about structure 306.

Structure 306 is input into tolerance analyzer 302 in these examples. Structure 306 may be input by a user or retrieved from a memory, such as storage devices 416 in FIG. 4. Tolerance analyzer 302 analyzes structure 306 by simulating point variation on one or more surfaces 312 of structure 306.

Platform 310 may be, for example, an aircraft or a portion of an aircraft. However, the different advantageous embodiments also recognize that some advantageous embodiments may be applied to other types of platforms 310. For example, without limitation, other advantageous embodiments may be applied to a mobile platform, a stationary platform, a land-based structure, an aquatic-based structure, a space-based structure and/or some other suitable object. More specifically, the different advantageous embodiments may be applied to, for example, without limitation, a submarine, a bus, a personnel carrier, tank, a train, an automobile, a spacecraft, a space station, a satellite, a surface ship, a power plant, a dam, a manufacturing facility, a building and/or some other suitable object.

In this illustrative example, surface 312 is a two-dimensional (2D) geometric figure in the 3D space of structure 306. However, surface 312 may also be a 3D component of structure 306. The advantageous embodiment disclosed here is a 3D structure 306 with a number of 2D surfaces 312. However, in other advantageous embodiments, a 2D or 3D surface 312 that is not a component of a 3D structure 306 is analyzed by tolerance analyzer 302.

Points 314 are defined on surface 312. Points 314 may be defined by a user or by tolerance analyzer 302. Points 314 may be defined in an area 316 of surface 312 in which an engineering definition specifies a desired tolerance 318. Point 320 and adjacent point 322 are instances of points 314. Adjacent point 322 is adjacent to point 320 such that the distance between point 320 and adjacent point 322 is less than the distance between point 320 and another point in points 314 on surface 312.

Point 320 and adjacent point 322 may have an associated rate of change constraint 324 and rate of change constraint 326, respectively. Since rate of change constraint 324 and rate of change constraint 326 may be specified over a particular distance along surface 312, such as 5 inches, rate of change constraint 324 and rate of change constraint 326 may be the same value.

In other advantageous embodiments, rate of change constraint 324 differs from rate of change constraint 326. In one advantageous embodiment, rate of change constraint 324 differs from rate of change constraint 326 because points 314 are defined at distances that do not match the distance specified in the rate of change engineering definition for surface 312.

In this illustrative example, rate of change constraint 324 represents a maximum deviation 328. Maximum deviation 328 is a maximum variance allowed for point 320 over a specified distance during simulation. The specified distance may be included in an engineering definition for surface 312. In another advantageous embodiment, maximum deviation 328 is a maximum variance allowed for point 320 between point 320 and adjacent point 322 or another point in points 314.

Likewise, rate of change constraint 326 represents a maximum deviation 330 in these depicted examples. Maximum deviation 330 is a maximum variance allowed for adjacent point 322 over a specified distance during simulation. The specified distance may be included in an engineering definition for surface 312. In another advantageous embodiment, maximum deviation 330 is a maximum variance allowed for adjacent point 322 between adjacent point 322 and point 320 or another point in points 314.

Tolerance analyzer 302 processes surface 312. In some advantageous embodiments, tolerance analyzer 302 processes surface 312 using pseudo-random computational algorithm 332. One example of pseudo-random computational algorithm 332 is a Monte Carlo method 334. By processing surface 312, tolerance analyzer 302 generates number of surfaces 336. Number of surfaces 336 may be of a quantity specified by a user. The quantity of number of surfaces 336 may alternatively be selected by tolerance analyzer 302 based on the number of points 314, desired tolerance 318, or another suitable condition.

In some advantageous embodiments, number of surfaces 336 differs from surface 312 by variations 338. Variations 338 are changes in the location of points 314 on number of surfaces 336. During the analysis, tolerance analyzer 302 applies pseudo-random computational algorithm 332 to surface 312 and generates value 340 for points 314 on number of surfaces 336. Value 340 may be a pseudo-random number applied to points 314. The application of value 340 may result in a translation or movement of a point, such as point 320 in number of surfaces 336, remains within rate of change constraint 324 and adjacent point 322 remains within rate of change constraint 326.

In some advantageous embodiments, maximum deviation for the points 342 is specified in the engineering definition of surface 312 in addition to desired tolerance 318. Maximum deviation for the points 342 may be a composite tolerance. A composite tolerance is a tolerance that restricts the variation of points 314 as a whole. In other words, the tolerance is applied to all of points 314 individually and not relative to each other.

In these examples, maximum deviation for the points 342 may be implemented, for example, by selecting number of surfaces 336 that have points 314 that fall outside maximum deviation for the points 342.

In this example, tolerance analyzer 302 stores the number of surfaces 336 with points 314 that fall both within and outside maximum deviation for the points 342. Tolerance analyzer 302 may report statistics for number of surfaces 336 to a user and/or store the statistics.

Tolerance analyzer 302 may then apply a statistical distribution 344 to variations 338 for number of surfaces 336. Tolerance analyzer 302 may use statistical distribution 344 to report on which of number of surfaces 336 fall outside rate of change constraint 324, rate of change constraint 326, and/or maximum deviation for points 342. An example of statistical distribution 344 is a normal or Gaussian distribution.

In some advantageous embodiments, a user may then determine whether the number of surfaces 336 that failed to remain within the various constraints is satisfactory to release the part to manufacturing, based on the results of tolerance analyzer 302. In another advantageous embodiment, tolerance analyzer 302 generates analysis 346.

Analysis 346 may be a decision resulting from tolerance analyzer 302 processing surface 312 of structure 306. In one illustrative example, analysis 346 is a decision whether or not to send structure 306 for redesign or reengineering. In such an illustrative example, the decision may be based on the simulated failure rate during manufacturing of structure 306. The decision may be affected by business rules. For example, analysis 346 may be a decision to reengineer structure 306 if the result of statistical distribution 344 is that 3% or more of number of surfaces 336 fall outside rate of change constraint 324, rate of change constraint 326, and/or maximum deviation for points 342. Of course, any business rule(s) may be applied during analysis 346 to generate a decision. Tolerance analyzer 302 may present analysis 346 using graphical user interface 348.

The illustration of tolerance analyzer 302 in FIG. 3 is not meant to imply physical or architectural limitations to the manner in which different advantageous embodiments may be implemented. Other components in addition to and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

For example, structure 306 may contain multiple surfaces 312. Surfaces 312 may contain more than two points 314. Point 320 may have more than one rate of change constraint 324. Pseudo-random computational algorithm 332 may be a non-random computational algorithm.

Figure 4:
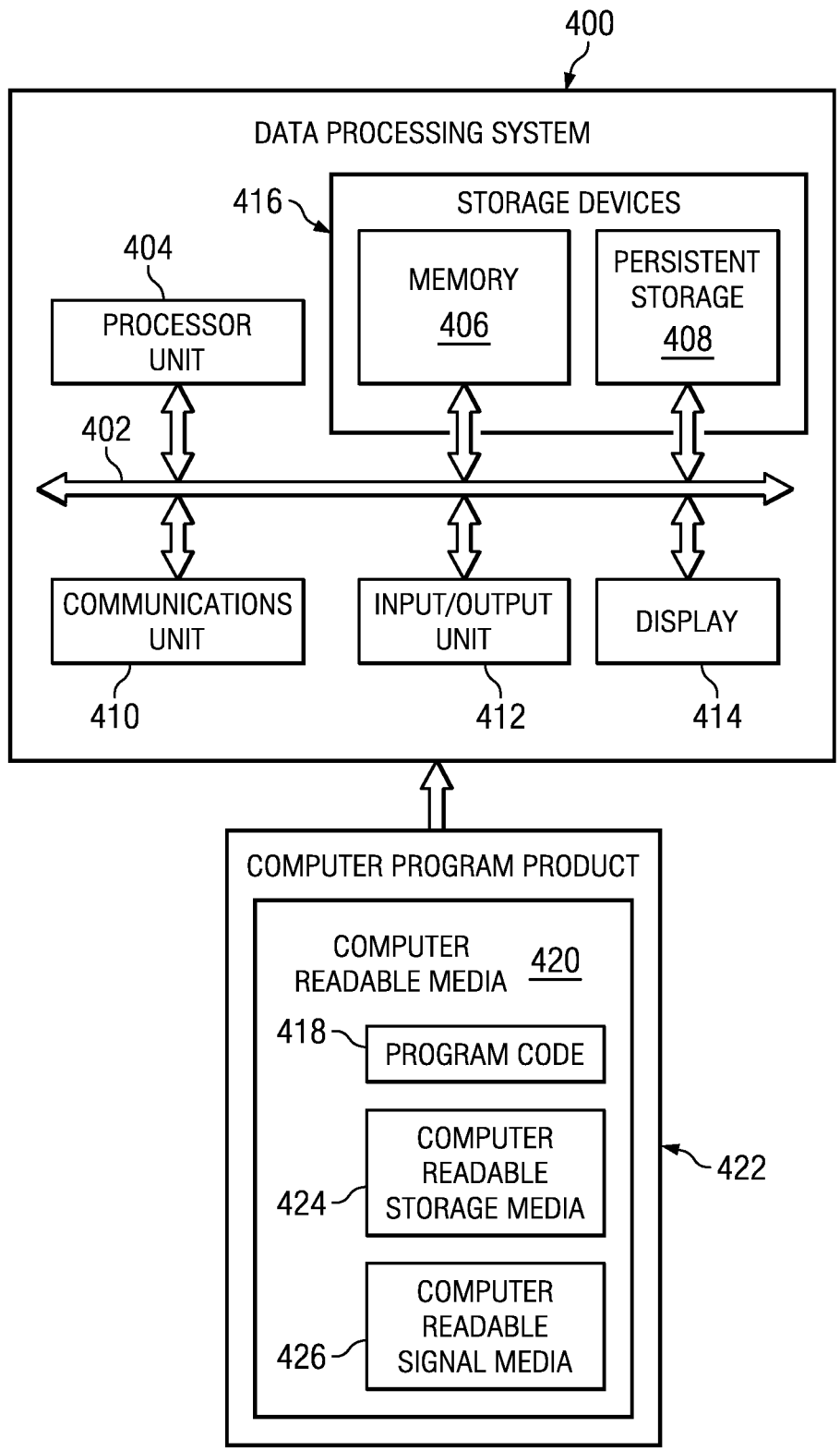
FIG. 4 depicts an illustration of a data processing system in accordance with an advantageous embodiment.

Turning now to FIG. 4, a diagram of a data processing system is depicted in accordance with an advantageous embodiment. Data processing system 400 may be used to implement computer system 304 in FIG. 3. In this advantageous example, data processing system 400 includes communications fabric 402, which provides communications between processor unit 404, memory 406, persistent storage 408, communications unit 410, input/output (I/O) unit 412, and display 414.

Processor unit 404 serves to execute instructions for software that may be loaded into memory 406. Processor unit 404 may be a set of one or more processors or may be a multi-processor core, depending on the particular implementation. Further, processor unit 404 may be implemented using one or more heterogeneous processor systems, in which a main processor is present with secondary processors on a single chip. As another advantageous example, processor unit 404 may be a symmetric multi-processor system containing multiple processors of the same type.

Memory 406 and persistent storage 408 are examples of storage devices 416. A storage device is any piece of hardware that is capable of storing information, such as, for example, without limitation, data, program code in functional form, and/or other suitable information either on a temporary basis and/or a permanent basis. Memory 406, in these examples, may be, for example, a random access memory, or any other suitable volatile or non-volatile storage device. Persistent storage 408 may take various forms, depending on the particular implementation. For example, persistent storage 408 may contain one or more components or devices. For example, persistent storage 408 may be a hard drive, a flash memory, a rewritable optical disk, a rewritable magnetic tape, or some combination of the above. The media used by persistent storage 408 may be removable. For example, a removable hard drive may be used for persistent storage 408.

Communications unit 410, in these examples, provides for communication with other data processing systems or devices. In these examples, communications unit 410 is a network interface card. Communications unit 410 may provide communications through the use of either or both physical and wireless communications links.

Input/output unit 412 allows for the input and output of data with other devices that may be connected to data processing system 400. For example, input/output unit 412 may provide a connection for user input through a keyboard, a mouse, and/or some other suitable input device. Further, input/output unit 412 may send output to a printer. Display 414 provides a mechanism to display information to a user.

Instructions for the operating system, applications, and/or programs may be located in storage devices 416, which are in communication with processor unit 404 through communications fabric 402. In these advantageous examples, the instructions are in a functional form on persistent storage 408. These instructions may be loaded into memory 406 for execution by processor unit 404. The processes of the different embodiments may be performed by processor unit 404 using computer implemented instructions, which may be located in a memory, such as memory 406.

These instructions are referred to as program code, computer usable program code, or computer readable program code that may be read and executed by a processor in processor unit 404. The program code, in the different embodiments, may be embodied on different physical or computer readable storage media, such as memory 406 or persistent storage 408.

Program code 418 is located in a functional form on computer readable media 420 that is selectively removable and may be loaded onto or transferred to data processing system 400 for execution by processor unit 404. Program code 418 and computer readable media 420 form computer program product 422. In one example, computer readable media 420 may be computer readable storage media 424 or computer readable signal media 426. Computer readable storage media 424 may include, for example, an optical or magnetic disc that is inserted or placed into a drive or other device that is part of persistent storage 408 for transfer onto a storage device, such as a hard drive, that is part of persistent storage 408. Computer readable storage media 424 also may take the form of a persistent storage, such as a hard drive, a thumb drive, or a flash memory that is connected to data processing system 400. In some instances, computer readable storage media 424 may not be removable from data processing system 400.

Alternatively, program code 418 may be transferred to data processing system 400 using computer readable signal media 426. Computer readable signal media 426 may be, for example, a propagated data signal containing program code 418. For example, computer readable signal media 426 may be an electro-magnetic signal, an optical signal, and/or any other suitable type of signal. These signals may be transmitted over communications links, such as wireless communications links, an optical fiber cable, a coaxial cable, a wire, and/or any other suitable type of communications link. In other words, the communications link and/or the connection may be physical or wireless in the advantageous examples.

In some advantageous embodiments, program code 418 may be downloaded over a network to persistent storage 408 from another device or data processing system through computer readable signal media 426 for use within data processing system 400. For instance, program code stored in a computer readable storage media in a server data processing system may be downloaded over a network from the server to data processing system 400. The data processing system providing program code 418 may be a server computer, a client computer, or some other device capable of storing and transmitting program code 418.

The different components illustrated for data processing system 400 are not meant to provide architectural limitations to the manner in which different embodiments may be implemented. The different advantageous embodiments may be implemented in a data processing system including components in addition to or in place of those illustrated for data processing system 400. Other components shown in FIG. 4 can be varied from the advantageous examples shown. The different embodiments may be implemented using any hardware device or system capable of executing program code. As one example, data processing system 400 may include organic components integrated with inorganic components and/or may be comprised entirely of organic components excluding a human being. For example, a storage device may be comprised of an organic semiconductor.

As another example, a storage device in data processing system 400 is any hardware apparatus that may store data. Memory 406, persistent storage 408, and computer readable media 420 are examples of storage devices in a tangible form.

In another example, a bus system may be used to implement communications fabric 402 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 406 or a cache such as found in an interface and memory controller hub that may be present in communications fabric 402.

Figure 5:
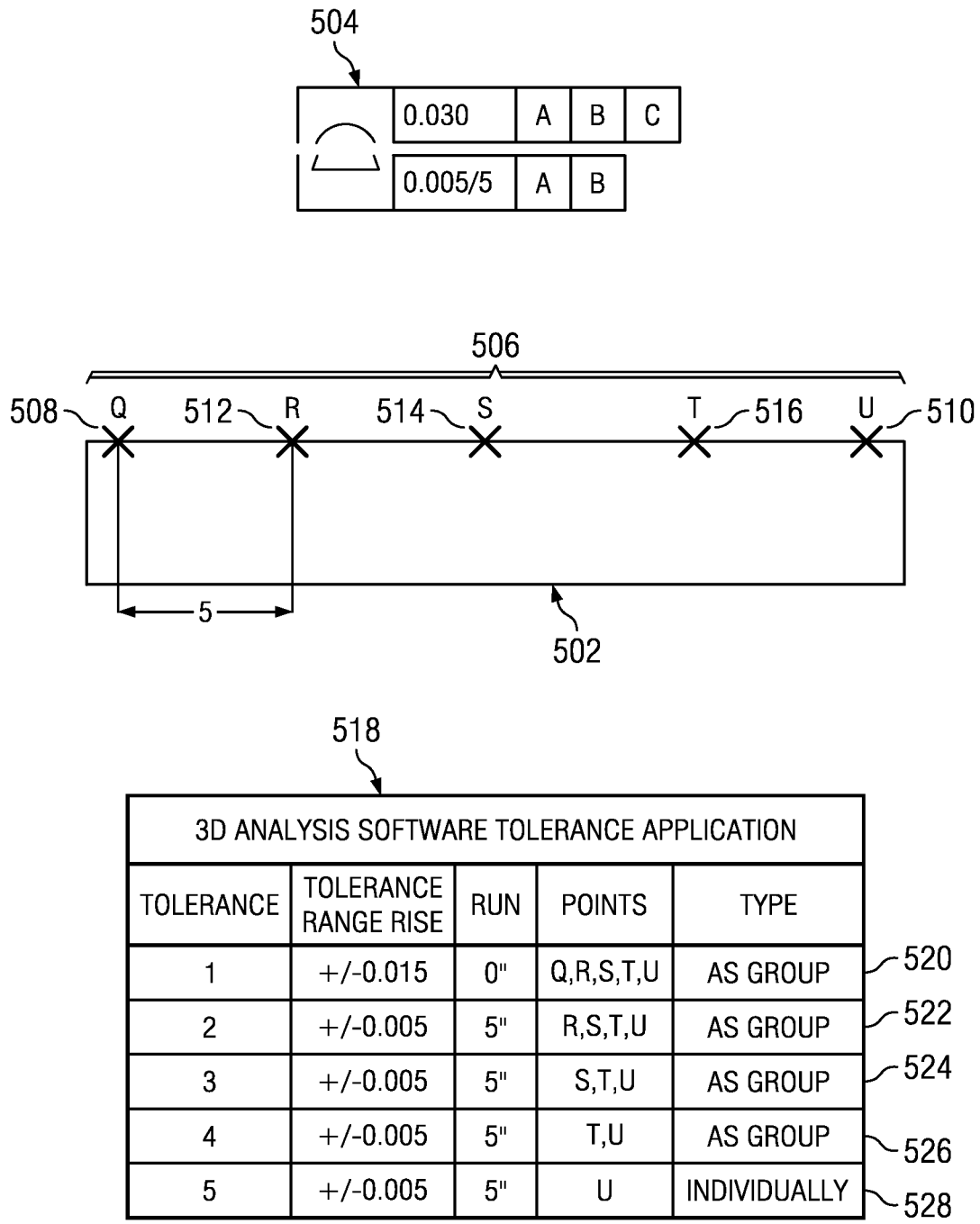
FIG. 5 depicts an example surface, engineering requirement, and table of tolerances representing the engineering requirement for simulation in accordance with an advantageous embodiment.

Turning now to FIGS. 5-10, an example representation of a composite profile with a surface rate of change requirement in accordance with an advantageous embodiment is depicted. Specifically, FIG. 5 depicts an example surface, engineering requirement, and table of tolerances representing the engineering requirement for simulation in accordance with an advantageous embodiment.

Surface 502 is an example of a surface, such as surface 312 from FIG. 3. Surface 502 may be presented as a part of graphical user interface 348 from FIG. 3. Engineering requirement 504 is an example of an engineering requirement for surface 502. As depicted in FIG. 5, engineering requirement 504 states that, along edge 506, surface 502 may vary up to 0.030 inches across the entire span of point Q 508 to point U 510. Points 508, 512, 514, 516, and 510 may be points like points 314 in FIG. 3. Engineering requirement 504 also states that edge 506 may not vary by more than 0.005 over a run or distance of 5 inches. Point 508 is separated from point 512 by a distance of 5 inches. Likewise, point 512 is 5 inches from point 514, and so on.

Table 518 is a representation of the rate of change constraints for points along edge 506. Each row 520, 522, 524, 526, and 528 in table 518 represents a rate of change constraint, such as rate of change constraint 324 from FIG. 3, for the group of points listed in the given row. The data in table 518 may be entered by a user or, in other advantageous embodiments, determined by a tolerance analyzer like tolerance analyzer 302 from FIG. 3.

The tolerance range rise data in table 518 indicates the maximum possible deviation for the points listed in a given row. For example, row 520 shows a tolerance range rise of +/−0.015 inches for the group of points Q, R, S, T, and U. Row 520, therefore, represents the composite tolerance requirement of 0.030 inches because the group of points Q-U (508, 512, 514, 516, 510) must not exceed 0.015 inches in either direction.

Likewise, row 522 indicates that the group of points R, S, T, and U (512, 514, 516, 510) may not deviate more than 0.005 inches in either direction over a distance of 5 inches. When combined with the data in rows 524, 526 and 528, table 518 accurately represents the 0.005/5 engineering requirement of engineering requirement 504.

Of course, the values shown in FIG. 5 are only illustrative examples. Other data, values, measurements, and scales may be used in place of or in addition to these data, values, measurements, and/or scales. For example, surface 502, engineering specification 504, table 518, edge 506, points 508, 512, 514, 516, 510, and rows 520-528 may be replaced or combined with other values, data, measurements, and/or scales for modeling different surfaces.

FIGS. 6-9 depict examples of the selection of values for each of the points 508, 512, 514, 516, and 510 during simulation in accordance with an advantageous embodiment. The simulation may be performed by a tolerance analyzer, such as tolerance analyzer 302 from FIG. 3.

Figure 6:
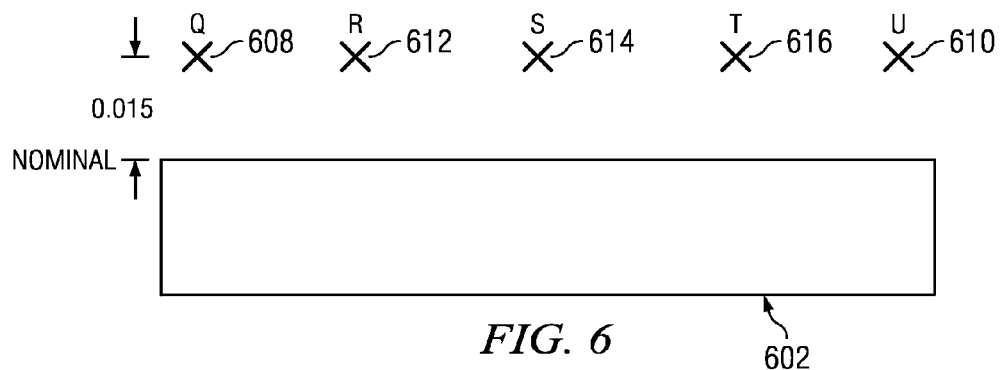
FIG. 6 depicts applying a first tolerance from FIG. 5 in accordance with an advantageous embodiment.

FIG. 6 depicts applying tolerance 1 from row 520 in accordance with an illustrative embodiment. Surface 602 is a surface like surface 502. Points Q-U 608, 612, 614, 616, 610, are points Q-U 508, 512, 514, 516, 510 after applying tolerance 1 from row 520. Points Q-U 608, 612, 614, 616, 610, are a worst-case example of tolerance requirement 1 from row 520. In this example, the maximum value for the movement of points Q-U 608, 612, 614, 616, 610 that maintains tolerance 1 in row 520, that is, 0.015 inches was selected. The value of 0.015 may be chosen using pseudo-random computational algorithm 332.

Figure 7:
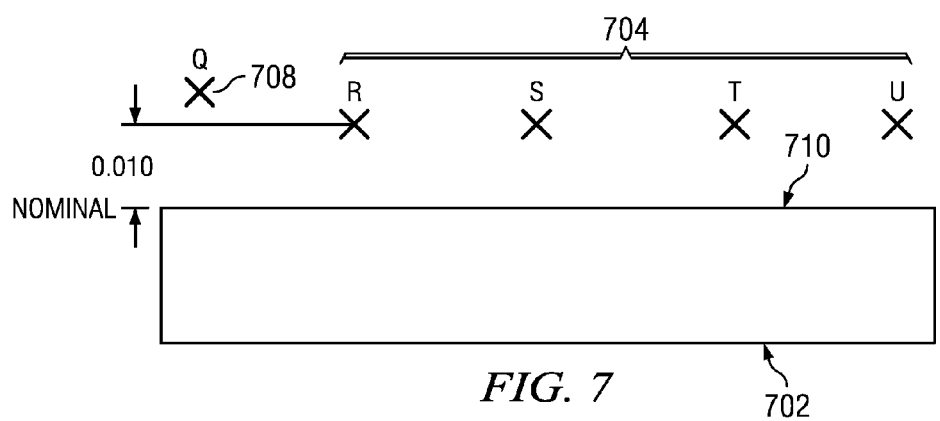
FIG. 7 depicts applying a second tolerance from FIG. 5 in accordance with an advantageous embodiment.

FIG. 7 depicts applying tolerance 2 from row 522 in accordance with an illustrative embodiment. Surface 702 is a surface like surface 502. Because tolerance 2 from row 522 applies to the point group R-U 512, 514, 516, 510, only point group R-U 704 has been varied. Point Q 708 has not moved and remains in the same position shown for point Q 608. In this example, a worst-case value of −0.05 was selected to vary point group R-U 704. Therefore, point group R-U is 0.01 inches from nominal edge 710. Nominal edge 710 is an edge like edge 506. Note that if a value greater than 0 was selected for tolerance 2 from row 522, tolerance 1 from row 520 would be violated. That is, points in the group Q-U would be beyond the +/−0.015 inch tolerance of tolerance 1 in row 520.

Figure 8:
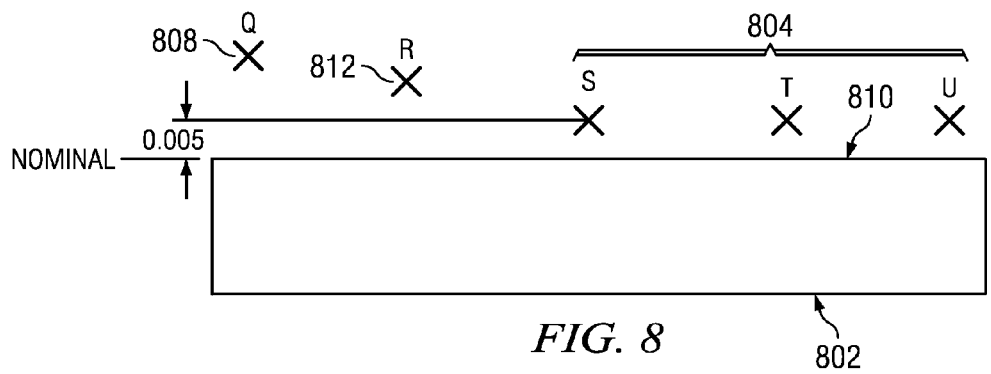
FIG. 8 depicts applying a third tolerance from FIG. 5 in accordance with an advantageous embodiment.

Turning now to FIG. 8, the application of tolerance 3 from row 524 in FIG. 5 in accordance with an advantageous embodiment is depicted. Surface 802 is a surface like surface 502. Tolerance 3 from row 524 applies to the point group S-U 804. Point Q 808 has not moved and remains in the same position shown for point Q 608. Likewise, Point R 812 has not moved and remains in the same position shown for point R 812. Point group S-U 804 is points S-U 514, 516, 510 from FIG. 5. Point group 804 may move in either the positive or negative direction without violating another tolerance from table 518. In this example, a value of −0.005 is selected. Point group 804 is depicted after tolerance 3 is applied, that is, 0.005 from nominal edge 810. Nominal edge 810 is an edge like edge 506.

Figure 9:
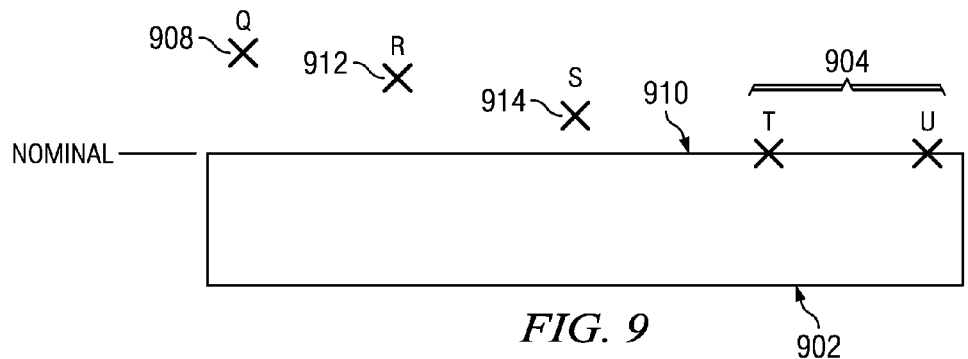
FIG. 9 depicts applying a fourth tolerance from FIG. 5 in accordance with an advantageous embodiment.

FIG. 9 depicts the application of tolerance 4 from row 526 in FIG. 5 in accordance with an advantageous embodiment. Surface 902 is a surface like surface 502. Tolerance 4 from row 526 is applied to point group T-U 904. Point group T-U is composed of points T-U like points T-U 516 and 510. Points Q-S 908, 912, 914, are points like points Q-S 508, 512, 514. In this example, a value of −0.005 inches was selected for tolerance 4 from row 526 The value for tolerance 4 from row 526, may be selected pseudo-randomly, like all values for tolerances in row 520. This value does not cause point group T-U 904 to exceed any tolerances from table 518. In this example, point group T-U has returned to 0 inches from nominal edge 910.

Figure 10:
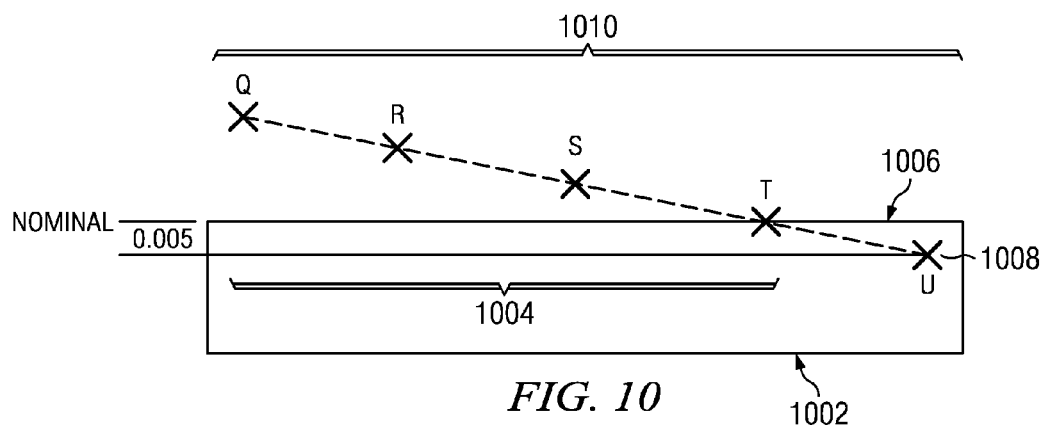
FIG. 10 depicts applying a fifth tolerance from FIG. 5 in accordance with an advantageous embodiment.

FIG. 10 depicts the application of tolerance 5 from row 528 in FIG. 5 in accordance with an advantageous embodiment. Surface 1002 is a surface like surface 502. Point group Q-T 1004 is composed of points like points Q-T 508-516. Point group Q-T 1004 is not affected by the application of tolerance 5 from row 528. Only point U 1008 is varied in the application of tolerance 5 from row 528, as shown in row 528. The value selected to vary point U 1008 could be any value within tolerance 5 from row 528, that is, +/−0.005 inches, without exceeding the other tolerances in table 518. A value of −0.005 is again chosen in this example. Point U is varied to −0.005 inches from nominal edge 1006. Nominal edge 1006 is an edge like edge 506.

Edge 1010 is created by the combination of point group Q-T 1004 and point U 1008. A structure containing a surface with edge 1010 meets the engineering definition specified in engineering definition 504. In one advantageous embodiment, a structure containing a surface with edge 1010 is generated as one of number of surfaces 336 during simulation by tolerance analyzer 302. The surface is recorded as successful because edge 1010 meets the engineering definition, that is, does not violate either the composite tolerance requirement component or the rate of change tolerance requirement component of engineering definition 504.

In some advantageous embodiments, one or more additional conditions are applied to generated surfaces before determining whether the surface is a success. A surface with a straight edge is described in the advantageous embodiments in connection with FIGS. 5-10. In other advantageous embodiments, however, the surface is a closed loop. In embodiments where the surface to be analyzed is a closed loop, an additional condition may be imposed on surfaces generated by tolerance analyzer 302. The additional condition may be that, after simulation, the final point simulated must be within a predetermined distance of the first point. The condition ensures that only generated surfaces that retain the closed loop characteristic of the original surface are marked as successful.

Figure 11:
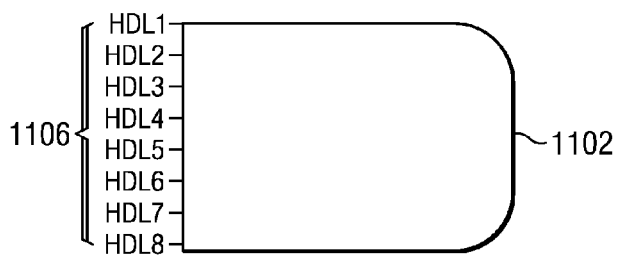
FIG. 11 depicts an illustration of a graphical user interface presenting a dialog box and a model in accordance with an illustrative embodiment.

Turning now to FIG. 11, an illustration of a graphical user interface presenting a dialog box and a model is depicted in accordance with an illustrative embodiment. Graphical user interface 1100 may be a graphical user interface 348. Graphical user interface 1100 may be generated by data processing system 400 and displayed by display 414.

Graphical user interface 1100 presents model 1102 and dialog box 1104. Model 1102 has edge 1106. Edge 1106 contains points, such as points 314. Dialog box 1104 presents fields to enter tolerance data. In this example, dialog box 1104 presents fields with respect to a tolerance that applies to all eight points on edge 1106. Name field 1108 contains a name for the current tolerance.

Description 1110, which is set by a user in some advantageous embodiments, indicates that the current tolerance is a first tolerance for a composite tolerance of 0.020 inches and a 0.005 inch rate of change tolerance over 1 inch. The setting in mode field 1112, shown as Group in this example, indicates whether the current tolerance applies to a group of points or each point individually.

Features field 1114 lists the points to which the current tolerance, TOL_1 in this case, applies. In this example, TOL_1 applies to points HDL1-HDL8. In some advantageous embodiments, a scroll bar control may be presented in dialog box 1104. The scroll bar control provides buttons to scroll through a list, of which only a part is visible at a given time.

Distribution field 1116 presents options regarding what statistical distribution to apply to the tolerance, such as statistical distribution 344. Range field 1118 presents the maximum deviation value for the tolerance, such as maximum deviation 328.

The illustration of graphical user interface 1100 in FIG. 11 is not meant to imply physical or architectural limitations to the manner in which different advantageous embodiments may be implemented. Other components in addition and/or in place of the ones Illustrated may be used. Some components may be unnecessary in some advantageous embodiments. Also, the controls are presented to illustrate some functional components. One or more of these controls may be combined and/or divided into different controls when implemented in different advantageous embodiments.

For example, dialog box 1104 may be a menu or spread across one or more windows. Name field 1108, features 1114, distribution 1116, group 1112, and range 1118 may be a drop-down list, a checkbox, or a digital handwriting field. Naturally, model 1102 may be any surface. Points along edge 1106 may also vary in number, distance, and location.

Figure 12:
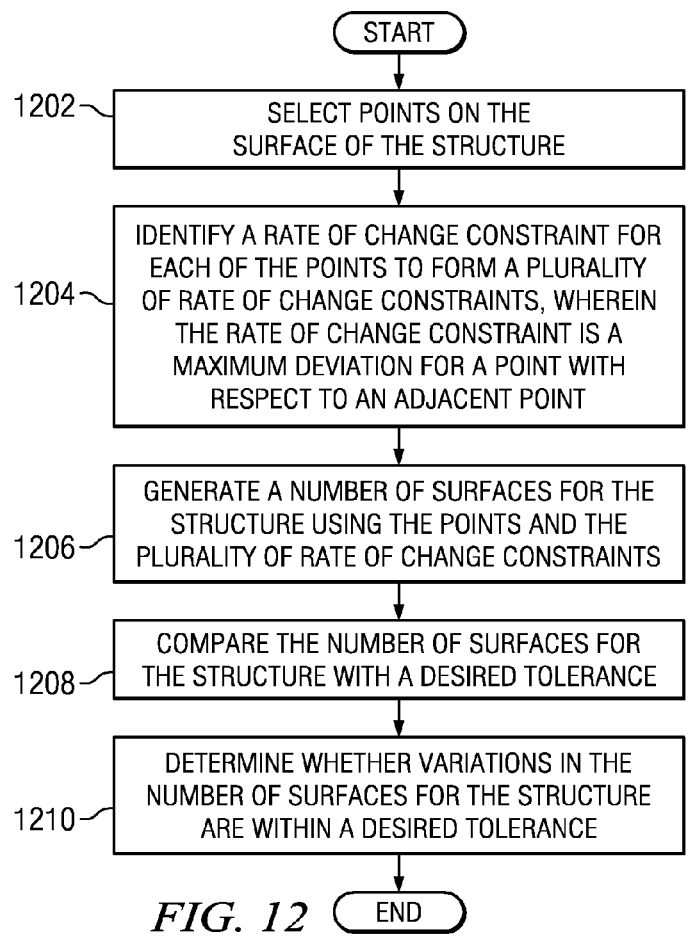
FIG. 12 depicts a flowchart for simulating a surface of a structure in accordance with an advantageous embodiment.

Turning now to FIG. 12, a flowchart for simulating a surface of a structure is depicted in accordance with an advantageous embodiment. In advantageous embodiments, the process is implemented in computer system 304. The process may be performed by tolerance analyzer 302.

The process begins by selecting points on the surface of a structure (operation 1202). The process then identifies a rate of change constraint for each of the points to form a plurality of rate of change constraints, wherein the rate of change constraint is a maximum deviation for a point with respect to an adjacent point (operation 1204). The process then generates a number of surfaces for the structure using the points and the plurality of rate of change constraints (operation 1206).

In some advantageous embodiments, the number of surfaces generated will comprise some successful surfaces where all points fall within the rate of change constraints. The number of surfaces generated also comprises some failed surfaces that have one or more points that fall outside the rate of change constraints. The process may store the number of successful and failed surfaces.

The process continues by comparing the number of surfaces for the structure with a desired tolerance (operation 1208). The desired tolerance may, for example, be set by the user or generated by the tolerance analyzer using a group of business rules. The process then determines whether variations in the number of surfaces for the structure are within a desired tolerance (operation 1210). The process terminates thereafter.

In some advantageous embodiments, the process may also provide a graphical user interface. An example of the graphical user interface is graphical user interface 348 in FIG. 3. The graphical user interface may present statistics regarding the number of successful and failed surfaces. For example, the graphical user interface may present the percentage of successful surfaces from the total number of surfaces generated. The process may also present, using the graphical user interface, the variations in each of the points from the number of surfaces plotted against a statistical distribution. For example, the values for a point from the number of surfaces generated by the process may be presented on a graph of a normal statistical distribution.

The graphical user interface may also include statistics such as, for example, the nominal measurement, the mean, the max, the min, the range of measurements, the lower and upper specification limits for the measurement, the percentage of measurement values falling outside the specification limits, and the statistical distribution that best fits the data.

Figure 13:
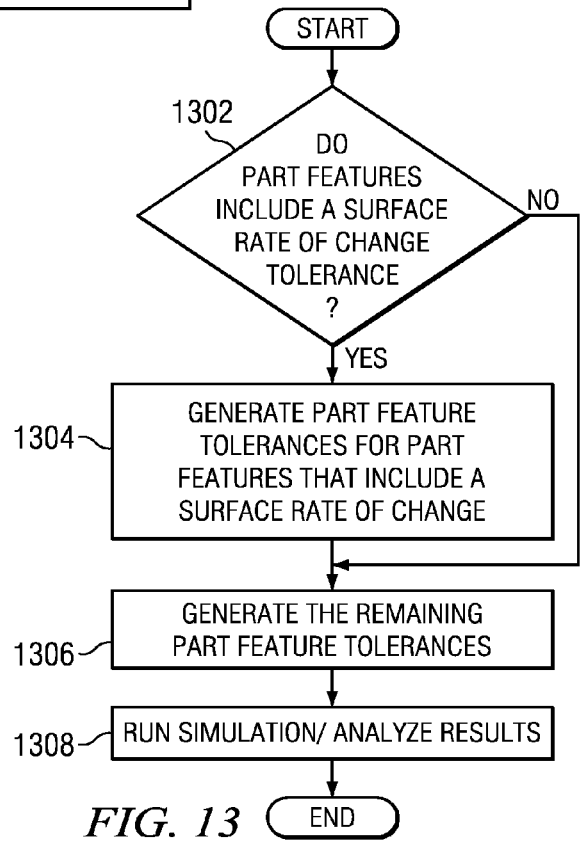
FIG. 13 depicts a flowchart of another process for simulating a surface in accordance with an advantageous embodiment.

FIG. 13 depicts a flowchart of another process for simulating a surface in accordance with an advantageous embodiment. In advantageous embodiments, the process is performed in computer system 304 by tolerance analyzer 302.

The process begins by determining whether one or more part features include a surface rate of change tolerance (operation 1302). If the process determines that one or more part features include a surface rate of change tolerance at operation 1302, the process generates part feature tolerances for part features that include a surface rate of change (operation 1304). The process then continues to operation 1306.

If the process determines that no part features include a surface rate of change tolerance at operation 1302, the process proceeds to operation 1306. The process then generates the remaining part feature tolerances (operation 1306). The remaining part feature tolerances may be part feature tolerances that do not include a rate of change tolerance.

The process then runs the simulation and analyzes the result (operation 1308). The simulation may be performed using a pseudo-random computational algorithm, such as pseudo-random computational algorithm 332. The process may generate a report or present results using a graphical user interface, for example. The process then terminates.

Figure 14:
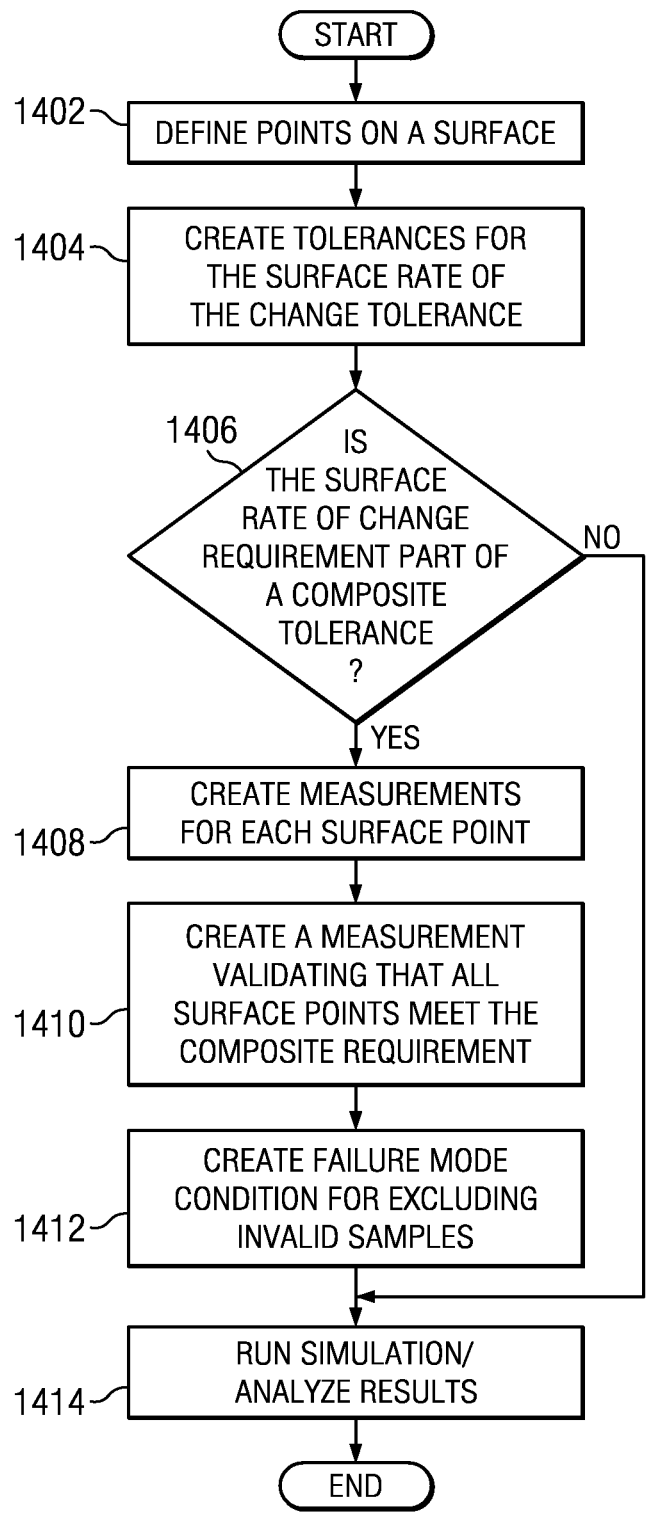
FIG. 14 depicts a flowchart for a process for generating part feature tolerances for part features that include a surface rate of change in accordance with an advantageous embodiment.

Turning now to FIG. 14, a flowchart for a process for generating part feature tolerances for part features that include a surface rate of change in accordance with an advantageous embodiment is depicted. The process may implement operation 1304 from FIG. 13. The process may be implemented in data processing system 400 and performed by tolerance analyzer 302.

The process begins by defining points on a surface (operation 1402). The location and proximity of points to each other may be selected by the user, or, in one advantageous embodiment, generated by the process given a particular surface and engineering requirement.

The process continues by creating tolerances for the surface rate of change tolerance (operation 1404). To create tolerances for the surface rate of change tolerance, the process may generate a table, such as table 518, or other data structure. The process may generate a row for each tolerance requirement in the engineering requirement as it applies to the points along the edge. In other advantageous embodiments, a user inputs the table with the desired tolerances for the rate of change requirement.

The process continues by determining whether the surface rate of change requirement is part of a composite tolerance (operation 1406). If the process determines that the surface rate of change requirement is not part of a composite tolerance, the process proceeds to operation 1414.

If the process determines that the surface rate of change requirement is part of a composite tolerance, the process creates measurements for each surface point (operation 1408). The measurements record the distance of the variation for each point. The process continues by creating a measurement validating that all surface points meet the composite requirement (operation 1410). The measurement in operation 1410 measures the number of measurements from operation 1408 that meet the composite tolerance requirement. In this example, the measurement in operation 1410 indicates whether or not all the measurements from operation 1408 meet the composite tolerance requirement. The process may set a condition on the measurement in operation 1410 that triggers a fail mode condition if one or more points do not meet the composite requirement.

The process then creates a failure mode condition for excluding invalid samples (operation 1412). The failure mode condition will create a build failure for any generated surfaces that contain one or more points that fail the composite tolerance requirement.

The process then runs the simulation and analyzes the results (operation 1414). The analysis may include applying a statistical distribution to the points in the generated surfaces. The analysis may also include presenting a graphical user interface with the statistical distribution. The process terminates thereafter.

Figure 15:
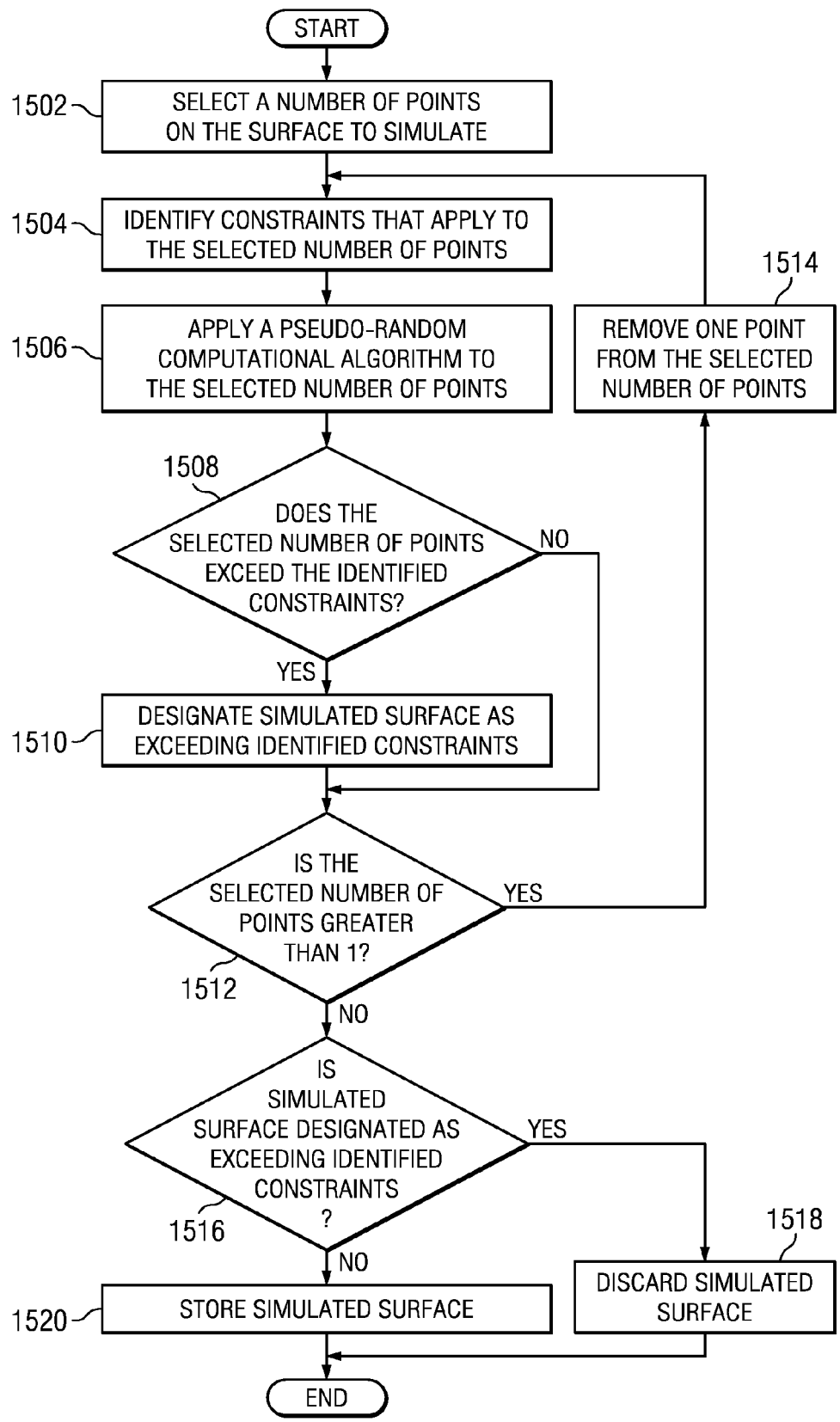
FIG. 15 depicts a flowchart for a process for generating variations in the points on a surface with a rate of change constraint in accordance with an advantageous embodiment.

Turning now to FIG. 15, a flowchart for a process for generating variations in the points on a surface with a rate of change constraint in accordance with an advantageous embodiment is depicted. The process may be implemented in data processing system 400 and performed by tolerance analyzer 302. In advantageous embodiments, the process in FIG. 15 is performed once for every simulated surface that is generated by tolerance analyzer 302. The simulated surfaces generated by tolerance analyzer 302 may be number of surfaces 336 in FIG. 3.

The process begins by selecting a number of points on a surface to simulate (operation 1502). The process then identifies constraints that apply to the selected number of points (operation 1504). In illustrative examples, a constraint that applies to the selected number of points is a rate of change tolerance constraint. An additional constraint may be a composite tolerance constraint.

The process continues by applying a pseudo-random computational algorithm to the selected number of points (operation 1506). The pseudo-random computational algorithm varies the position of the selected number of points on the surface. An example of a pseudo-random computational algorithm that may be used is a Monte Carlo method. In some advantageous embodiments, the pseudo-random computational algorithm generates values for the position of the selected number of points using a statistical distribution. The statistical distribution may be selected by the user.

In some advantageous embodiments, the user selects a normal statistical distribution for the pseudo-random computational algorithm. The pseudo-random computational algorithm generates values for the position of the selected number of points based on the function associated with the normal statistical distribution. The user may also enter a number of standard deviations. The number of standard deviations may be used to apply a maximum and minimum to the values chosen by the pseudo-random computational algorithm.

The process then determines whether the selected number of points exceeds the identified constraints (operation 1508). In an illustrative example, an identified constraint is a rate of change tolerance constraint. The process may determine whether the position of the selected number of points after applying the pseudo-random computational algorithm exceeds the rate of change tolerance constraint.

If the process determines that the selected point exceeds the identified constraints at operation 1508, the process designates the simulated surface as exceeding the identified constraints (operation 1510). The process then proceeds to operation 1512.

If the process determines that the selected point does not exceed the identified constraints at operation 1508, the process determines whether the selected number of points is greater than one (operation 1512). The selected number of points may be greater than one if the number of points consists of two or more points.

If the process determines that the selected number of points is greater than one, the process removes one point from the selected number of points (operation 1514). The process then returns to operation 1504. If the process determines that the selected number of points is not greater than one at operation 1512, the process determines whether the simulated surface is designated as exceeding the identified constraints (operation 1516). In an illustrative example, the process determines that the simulated surface is designated as exceeding the identified constraints because the simulated surface was designated as exceeding the identified constraints at operation 1508.

If the process determines that the simulated surface is designated as exceeding the identified constraints at operation 1516, the process discards the simulated surface (operation 1518). The process terminates thereafter.

In another advantageous embodiment, the process does not discard the simulated surface at operation 1518. In such an advantageous embodiment, the process stores the simulated surface. The simulated surface may retain the designation that the simulated surface exceeds identified constraints.

If the process determines that the simulated surface is not designated as exceeding the identified constraints at operation 1516, the process stores the simulated surface (operation 1520). In some advantageous embodiments, the process designates the simulated surface as meeting identified constraints. The process terminates thereafter.

In yet another advantageous embodiment, the process does not perform operation 1510. If the process determines that the selected number of points exceeds the identified constraints at operation 1508, the process proceeds to operation 1518 and discards the simulated surface.

The flowcharts and illustrations in the different depicted embodiments illustrate the architecture, functionality, and operation of some possible implementations of apparatus and methods in different advantageous embodiments. In this regard, each block in the flowchart or illustrations may represent a module, segment, function, and/or a portion of an operation or step. In some alternative implementations, the function or functions noted in the block may occur out of the order noted in the figures. For example, in some cases, two blocks shown in succession may be executed substantially concurrently, or the blocks may sometimes be executed in the reverse order, depending upon the functionality involved.

The different advantageous embodiments provide a dimensional analyst with the ability to accurately simulate surface rate of change tolerance requirements in engineering requirements. The analyst can simulate the rate of change without estimating or simplifying the variation with a composite tolerance. The rate of change requirement can be simulated in both individual and composite tolerance situations. Additionally, the rate of change requirement can be simulated on open and closed loop surfaces.

The different advantageous embodiments also provide a dimensional analyst with the ability to define points along an edge at constant or non-constant intervals. Additionally, multiple rate of change requirements can be simulated on the same part.

The different advantageous embodiments can take the form of an entirely hardware embodiment, an entirely software embodiment, or an embodiment containing both hardware and software elements. Some embodiments are implemented in software, which includes but is not limited to forms, such as, for example, firmware, resident software, and microcode.

Furthermore, the different embodiments can take the form of a computer program product accessible from a computer-usable or computer-readable medium providing program code for use by or in connection with a computer or any device or system that executes instructions. For the purposes of this disclosure, a computer-usable or computer readable medium can generally be any tangible apparatus that can contain, store, communicate, propagate, or transport the program for use by or in connection with the instruction execution system, apparatus, or device.

The computer usable or computer readable medium can be, for example, without limitation an electronic, magnetic, optical, electromagnetic, infrared, or semiconductor system, or a propagation medium. Non limiting examples of a computer-readable medium include a semiconductor or solid state memory, magnetic tape, a removable computer diskette, a random access memory (RAM), a read-only memory (ROM), a rigid magnetic disk, and an optical disk. Optical disks may include compact disk-read only memory (CD-ROM), compact disk-read/write (CD-R/W) and DVD.

Further, a computer-usable or computer-readable medium may contain or store a computer readable or usable program code such that when the computer readable or usable program code is executed on a computer, the execution of this computer readable or usable program code causes the computer to transmit another computer readable or usable program code over a communications link. This communications link may use a medium that is, for example without limitation, physical or wireless.

A data processing system suitable for storing and/or executing computer readable or computer usable program code will include one or more processors coupled directly or indirectly to memory elements through a communications fabric, such as a system bus. The memory elements may include local memory employed during actual execution of the program code, bulk storage, and cache memories which provide temporary storage of at least some computer readable or computer usable program code to reduce the number of times code may be retrieved from bulk storage during execution of the code.

Input/output or I/O devices can be coupled to the system either directly or through intervening I/O controllers. These devices may include, for example, without limitation to keyboards, touch screen displays, and pointing devices. Different communications adapters may also be coupled to the system to enable the data processing system to become coupled to other data processing systems or remote printers or storage devices through intervening private or public networks. Non-limiting examples are modems and network adapters are just a few of the currently available types of communications adapters.

The description of the different advantageous embodiments has been presented for purposes of illustration and description, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for simulating a surface of a structure in a virtual space, the method comprising:
   creating a failure mode condition for excluding invalid samples, wherein the failure mode condition is a rate of change value for a part feature exceeding a rate of change constraint;
   determining relative positions in the virtual space of a plurality of points on the surface of the structure using the rate of change constraint, wherein the rate of change constraint is a maximum deviation of the surface for the plurality of points over a specified distance along the surface for the part feature, wherein each point in the plurality of points is displaced by the rate of change constant; and
   generating in a processor a virtual model of the surface of the structure in the virtual space using the points, wherein each point is displaced independent of a neighboring point; using the virtual model and the rate of change constraint, comparing a rate of change value for the part feature to the rate of change constraint; and
   responsive to the rate of change value for the part feature exceeding the rate of change constraint, identifying the sample as an invalid sample.

2. The method of claim 1, wherein a first point in the plurality of points is limited by a first rate of change constant having a first maximum deviation, and a neighboring second point in the plurality of points is limited by a second rate of change constant having a second maximum deviation, the first rate of change constant different from the second rate of change constant, and further comprising:
   comparing the virtual model of the surface of the structure with a desired tolerance; and
   determining whether the virtual model of the surface of the structure is within the desired tolerance.

3. The method of claim 1, wherein the determining step comprises:
   randomly generating a value for the relative positions in the virtual space of adjacent ones of the points using the rate of change constraint.

4. The method of claim 3, wherein the step of randomly generating the value comprises performing a pseudo-random computational algorithm to generate the value.

5. The method of claim 1, wherein the structure is a simulation in the virtual space of a number of parts for a platform.

6. The method of claim 5, wherein the platform is selected from one of a mobile platform, a stationary platform, a land-based structure, an aquatic-based structure, a space-based structure, an aircraft, a surface ship, a tank, a personnel carrier, a train, a spacecraft, a space station, a satellite, a submarine, an automobile, a power plant, a bridge, a dam, a manufacturing facility, and a building.

7. The method of claim 1, wherein the points are spaced unequally on the surface of the structure.

8. A non-transitory computer program product comprising:
   a computer readable storage medium;
   program code, stored on the computer readable storage media, for creating a failure mode condition for excluding invalid samples, wherein the failure mode condition is a rate of change value for a part feature exceeding a rate of change constraint;
   program code, stored on the computer readable storage media, for determining relative positions in a virtual space of a plurality of points on a surface of a structure using the rate of change constraint, wherein the rate of change constraint is a maximum deviation of the surface for the plurality of points over a specified distance along the surface for the part feature, wherein each point in the plurality of points is displaced by the rate of change constant;
   program code, stored on the computer readable storage media, for generating a virtual model of the surface of the structure in the virtual space using the points, wherein each point is displaced independent of a neighboring point;
   program code, stored on the computer readable storage media, for using the virtual model and the rate of change constraint, comparing a rate of change value for the part feature to the rate of change constraint; and
   program code, stored on the computer readable storage media, for responsive to the rate of change value for the part feature exceeding the rate of change constraint, identifying the sample as an invalid sample.

9. The computer program product of claim 8, wherein a first point in the plurality of points is limited by a first rate of change constant having a first maximum deviation, and a neighboring second point in the plurality of points is limited by a second rate of change constant having a second maximum deviation, the first rate of change constant different from the second rate of change constant, and, further comprising:
   program code, stored on the computer readable storage media, for comparing the virtual model of the surface of the structure with a desired tolerance; and
   program code, stored on the computer readable storage media, for determining whether the virtual model of the surface of the structure is within the desired tolerance.

10. The computer program product of claim 8, further comprising:
    program code, stored on the computer readable storage media, for randomly generating a value for the relative positions in the virtual space of adjacent ones of the points using the rate of change constraint.

11. The computer program product of claim 10, wherein the program code for randomly generating the value comprises program code, stored on the computer readable storage media, for performing a pseudo-random computational algorithm to generate the value.

12. An apparatus comprising:
    a bus;
    a memory connected to the bus; and
    a processor unit connected to the bus, wherein the processor unit is configured to create a failure mode condition for excluding invalid samples, wherein the failure mode condition is a rate of change value for a part feature exceeding a rate of change constraint, determine relative positions in a virtual space of a plurality of points on a surface of a structure using the rate of change constraint, wherein the rate of change constraint is a maximum deviation of the surface for the plurality of points over a specified distance along the surface for the part feature, wherein each point in the plurality of points is displaced by the rate of change constant, and generate a virtual model of the surface of the structure in the virtual space using the points, wherein each point is displaced independent of a neighboring point, use the virtual model and the rate of change constraint, comparing a rate of change value for the part feature to the rate of change constraint, and responsive to the rate of change value for the part feature exceeding the rate of change constraint, identify the sample as an invalid sample.

13. The apparatus of claim 12, wherein a first point in the plurality of points is limited by a first rate of change constant having a first maximum deviation, and a neighboring second point in the plurality of points is limited by a second rate of change constant having a second maximum deviation, the first rate of change constant different from the second rate of change constant, and, wherein the processor unit is further configured to compare the virtual model of the surface of the structure with a desired tolerance; and determine whether the virtual model of the surface of the structure is within the desired tolerance.

14. The apparatus of claim 12, wherein the processor unit is configured to randomly generate a value for the relative positions in the virtual space of adjacent ones of the points using the rate of change constraint.

15. The apparatus of claim 14, wherein the processor unit is configured to randomly generate the value using a pseudo-random computational algorithm to generate the value.

* * * * *